United States Patent
Guerrieri et al.

[11] Patent Number: 5,981,932
[45] Date of Patent: Nov. 9, 1999

[54] NOISE COMPENSATION CIRCUIT FOR IMAGE SENSORS

[75] Inventors: Roberto Guerrieri; Roberto Rambaldi, both of Bologna; Marco Tartagni, Meldola, all of Italy

[73] Assignee: STMicroelectronics, Inc., Carrollton, Tex.

[21] Appl. No.: 08/964,571

[22] Filed: Nov. 5, 1997

[51] Int. Cl.⁶ ................................................. H01J 40/14
[52] U.S. Cl. ................................ 250/208.1; 250/214 R; 257/461; 348/308
[58] Field of Search .......................... 250/208.1, 214.1, 250/214 R, 214 LS, 214 LA; 257/461, 444, 239, 290–293; 348/308–310

[56] References Cited

U.S. PATENT DOCUMENTS 4,843,473  6/1989  Bencuya et al. .
4,902,886  2/1990  Smisko ................................. 250/214 R
5,854,498 12/1998  Merrill .................................... 257/461

OTHER PUBLICATIONS

Eiji Oba, et al., "A ¼ Inch 330k Square Pixel Progressive Scan CMOS Active Pixel Image Sensor," Feb. 7, 1997, *Digest of Technical Papers*, pp. 180–181.

McGrath, R. Daniel, et al., "Current–Mediated, Current–Reset 768×512 Active Pixel Sensor Array," Feb. 7, 1997, *Digest of Technical Papers*, pp. 182–183.

Eric R. Fossum, "CMOS Image Sensors: Electronic Camera On a Chip," Dec. 10–13, 1995, *International Electron Devices Meeting Technical Digest*, pp. 17–25.

Nobuo Nakamura, et al., "A Random Noise Reduction Method for an Amorphous Silicon Photoconversion Layer Overlaid CCD Imager" pp. 1663–1666, 1997, *IEEE*, Oct. 1997.

*Primary Examiner*—Que T. Le
*Attorney, Agent, or Firm*—Theodore E. Galanthay; Lisa K. Jorgenson; Jeffrey K. Weaver

[57] ABSTRACT

Disclosed is a method and associated apparatus for compensating for kTC noise in individual pixels of an MOS imaging array. The kTC noise at issue forms when a pixel is disconnected from a reset voltage by turning off an MOS transistor which controls access to the pixel photodiode. Compensation is accomplished by first exposing the photodiode to the reset voltage and then disconnecting the well region from $V_{dd}$ to cause it to float. By allowing the well to float, the kTC charge subsequently introduced (at the conclusion of the reset process) redistributes so that most of it accumulates on the capacitor between the well and the substrate. Later, the well is reclamped to $V_{dd}$, and the noise contribution stored in the well-substrate capacitor is canceled. A disclosed apparatus includes an array of pixels, each having a separate well. In addition, access of the well to a source of power ($V_{dd}$) must be switchable. Therefore, a transistor is included at each pixel's connection to a $V_{dd}$.

22 Claims, 3 Drawing Sheets

NOISE COMPENSATION CIRCUIT FOR IMAGE SENSORS

BACKGROUND OF THE INVENTION

The present invention relates to pixel arrays for MOS cameras. More particularly, the present invention relates to techniques and associated apparatus for compensating for thermal noise variably introduced to individual pixels during resetting of a pixel array.

CMOS image sensors are now becoming competitive with charge coupled device ("CCD") array image sensors. Potential applications include digital cameras, night time driving displays for automobiles, and computer peripherals for document capture and visual communications.

Since the 1970s, CCD arrays have dominated the electronic image sensor market. They have outperformed CMOS array sensors in most important criteria including quantum efficiency, optical fill factor (the fraction of a pixel used for detection), charge transfer efficiency, readout rate, readout noise, and dynamic range. However, the steady improvement in CMOS technology (including increasingly small device size) has moved CMOS image sensors into a competitive posture. Further, in comparison to CCD technology, CMOS technology provides lower power consumption, increased functionality, and potentially lower cost. Researchers now envision single chip CMOS cameras having (a) integrated timing and control electronics, (b) a sensor array, (c) signal processing electronics, (d) an analog to digital converter, and (e) interface electronics. See Fossum, "CMOS Image Sensors: Electronic Camera On A Chip, "1995 IEDM Technical Digest, Wash. DC, Dec. 10–13, 1995, pp. 17–25 which is incorporated herein by reference for all purposes.

CCD arrays are limited in that all image data is read by shifting analog charge packets from the CCD array interior to the periphery in a pixel-by-pixel manner. The pixels of the CCD array are not randomly addressable. In addition, due to voltage, capacitance, and process constraints, CCD arrays are not well suited to integration at the level possible in CMOS integrated circuits. Hence, any supplemental processing circuitry required for CCD sensors (e.g., memory for storing information related to the sensor) must generally be provided on separate chips. This, of course, increases the system's cost.

Despite the advances of CMOS image sensor technology, certain remaining problems prevent their widespread acceptance. One such problem is the noise introduced in CMOS pixels, particularly "passive pixels"; active pixels contain an on-pixel amplifier while passive pixels do not. Read noise on a passive pixel is typically of the order of 250 electrons r.m.s., in comparison to 20 electrons on commercial CCD pixels.

The genesis of noise introduced on passive pixels can be understood as follows. In CMOS arrays, each pixel must be reset after the image is "read". Generally, this reset step requires that each pixel have an associated transistor switched on to allow a reset voltage to reach the photodiode of the associated pixel. When the associated transistor is turned off, the voltage of the photodiode should be equal to the reset voltage. However, thermal noise in the transistor channel introduce some variability in the quantity of charge injected in each pixel after each reset. Because thermal noise is truly random, voltage variations on individual pixels occurring once will not necessarily occur with the same variation a second time. Therefore, it is impossible to sample the noise at an initial time, store information regarding that noise, and use the stored information for a correction.

Often in the following description, the thermal noise at the root of the above problem will be referred to as "kTC noise". This is to indicate that the noise magnitude is related to k, the boltzmann constant, T, the temperature in Kelvin, and C, the capacitance in the current path. Technically, the magnitude of the noise is proportional to the square root of the product of the Boltzmann constant, the temperature in Kelvin, and the capacitance in the pixel's current path. The local temperature variations in each pixel give rise to this random noise.

What is needed is an improved MOS image sensor that can compensate for kTC noise.

SUMMARY OF THE INVENTION

The present invention provides a method and associated apparatus for compensating for kTC noise in individual pixels of an MOS imaging array. Random noise generated during the reset process is manifest as variations in the charge stored on a pseudo-capacitor formed at the p-n junction of a photodiode diffusion and an underlying well. The present invention makes use of a second pseudo-capacitor-residing at the junction of the well region with the bulk substrate —to store most of the charge associated with kTC noise. This is accomplished by first exposing the photodiode to the reset voltage and then disconnecting the well region from $V_{ss}$ or $V_{dd}$ causing it to float. By allowing the well to float, the kTC charge subsequently introduced redistributes so that most of it accumulates on the capacitor between the well and the substrate. Later, when the well is reclamped to $V_{dd}$ or $V_{ss}$, the voltage noise stored in the well-substrate capacitor is canceled.

To implement this kTC noise compensation technique, a separate well should be provided for each pixel. In addition, access of the well to a source of power or ground ($V_{dd}$ or $V_{ss}$) must be switchable. Therefore, a transistor is typically included at each pixel's connection to a $V_{dd}$ or $V_{ss}$ line.

One aspect of the present invention provides a method of canceling noise in an image sensor having an array of pixels, each including a photodiode diffusion in a well, with the well formed in a semiconductor substrate. The method may be characterized as including the following (for given pixel): (a) resetting the bias of the photodiode diffusion by exposing the photodiode diffusion to a reset voltage; (b) disconnecting the well from power or ground, thereby allowing the voltage within the well to float with respect to power and ground; (c) disconnecting the photodiode diffusion from the reset voltage thereby introducing noise into the photodiode, which noise comprises (i) a first voltage drop across an interface between the photodiode diffusion and the well, and (ii) a second voltage drop, which is greater than the first voltage drop, across an interface between the well and the semiconductor substrate; and (d) reconnecting the well to power or ground, thereby canceling the noise of the second voltage drop. After this process is complete, the image sensor may be exposed to a radiation pattern to charge the pixel to a voltage representing the integral of illumination with respect to time for the radiation to which it was exposed.

Another aspect of the invention provides an image sensor suitable for implementing the above method. Such image sensor will include an array of pixels, at least some of which may be characterized as including the following features: (a) a semiconductor substrate; (b) a well of a first conductivity type formed in the semiconductor substrate and separated from wells of adjacent pixels; (c) a photodiode diffusion of a second conductivity type, opposite that of the first conductivity type, formed in the well; (d) a source of power or ground; (e) a tap to power or ground also formed in the well; and (f) a switch disposed between the source of power and ground and the tap, whereby when the switch is opened, the pixel potential in the well floats.

Preferably the one or more pixels are separately addressable passive pixels. In a further preferred embodiment, the photodiode diffusion is n-type and the well is p-type. In this case, the well be biased to power ($V_{dd}$) at (d). To allow separate control of each pixel's well (for individual noise compensation), the wells of the pixels are preferably separated from one another.

The sensor should also include circuitry for resetting the pixels (e.g., a charge integrator) so that the pixels have the charge associated with a dark state (i.e., the pixels have not been exposed to light). Preferably, this circuitry for resetting the pixels is coupled to the photodiode diffusion through a switch, such that when the switch is closed, the photodiode diffusion is held at a reset voltage and when the switch is opened, the photodiode diffusion is unclamped from the reset voltage.

Another aspect of the invention provides a system for producing an image of an object. This system includes an imager of the type described above and one or more components for outputting an image resulting from the outputs of the one or more pixels. The image may be a photograph in the case of a digital camera for example.

The features and advantage of the present invention can be further understood with reference to the following Detailed Description and the associated figures.

DETAILED DESCRIPTION OF THE PREFERRED EMBODIMENTS

The invention will be described with reference to certain preferred embodiments set forth below. Specifically, the invention will be described with reference to a particular sensor pixel design and a few variants thereof. It should be understood that the invention is in no way specifically limited to these embodiments. For example, while that pixel design is presented as a "passive" design, it can in principal be applied to other designs such as active pixel designs.

While the description that follows focuses on a single pixel, it should be understood that many such pixels are typically provided in a pixel array formed according to a CMOS fabrication procedure. A typical CMOS imager includes a plurality of regularly arranged pixels each capable of responding to radiation impinging on the sensor. Often, as in the case of most digital cameras, the radiation will be visible electromagnetic radiation. Detection of other types of radiation is within the purview of this invention. In a preferred embodiment, the pixels comprising the array are randomly addressable by connection to word lines and bit lines are other appropriate architecture.

Figure 1A:
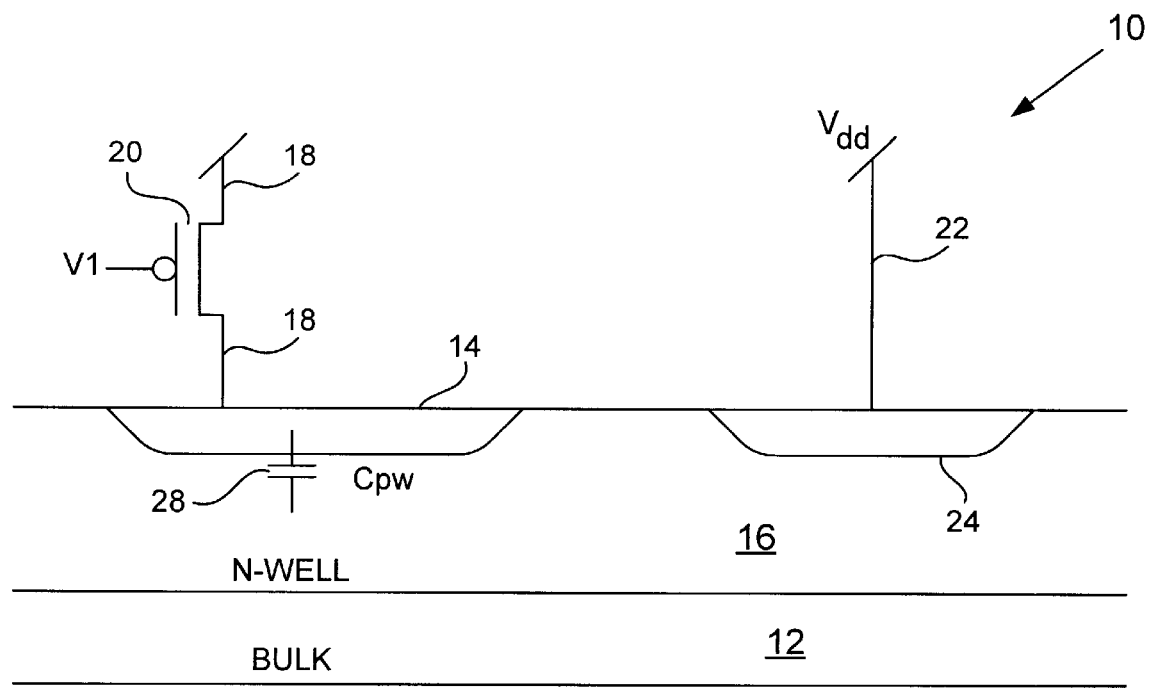
FIG. 1A is a side-sectional illustration of a photodiode passive pixel element of the type useful in a CMOS camera for example.
Figure 2B:
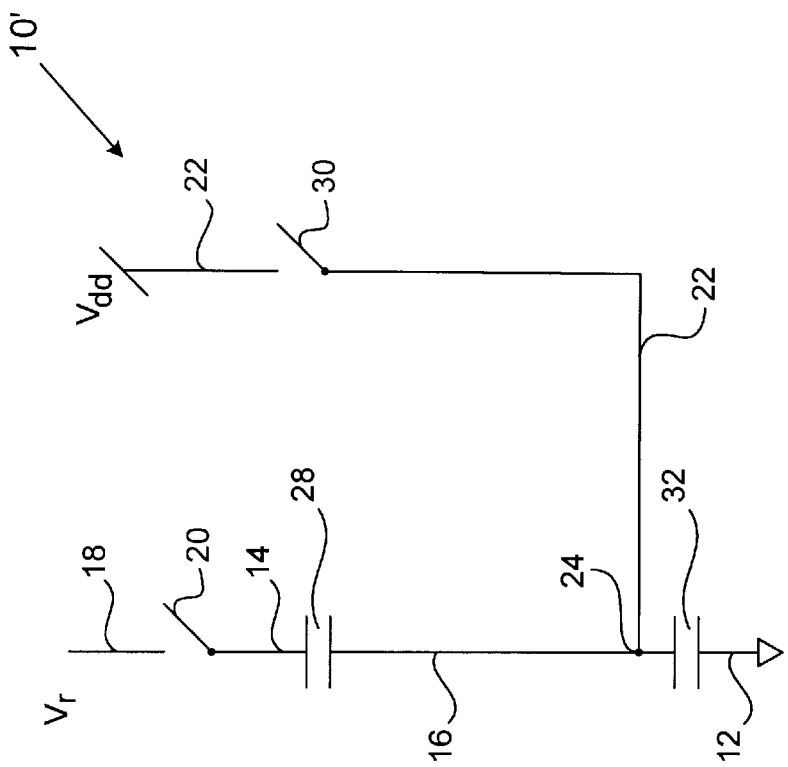
FIG. 2B is a schematic illustration as in FIG. 2A, but representing the pixel shown in FIG. 1B.
Figure 2A:
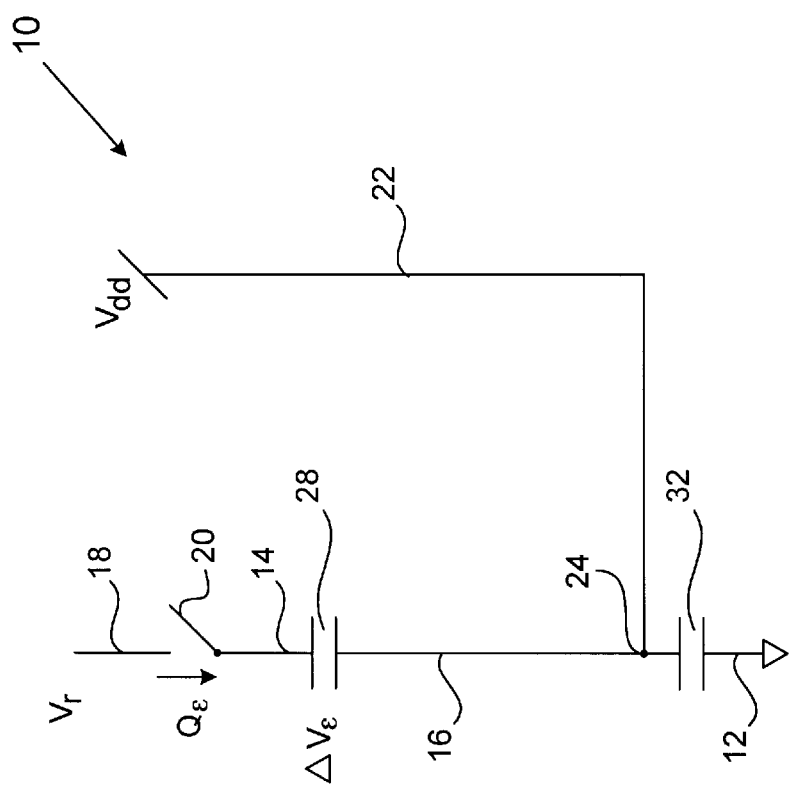
FIG. 2A is a schematic illustration of pixel element of FIG. 1A and showing junction capacitors defined by p-n junctions in the pixel.

FIGS. 1A and 2A will be used to illustrate conventional operation of a photodiode and the problem created by thermal noise in the photodiode of an MOS array. FIG. 1A presents a cross-sectional slice of a pixel 10 having a photodiode formed a p-type substrate 12. FIG. 2A presents a schematic illustration of pixel 10. The photodiode includes a photodiode diffusion 14 formed in a well 16. To conserve space, well 16 will typically span many or all pixels in a photodiode array. To simplify this explanation, only a single photodiode diffusion will be illustrated.

A depletion region at the interface between photodiode diffusion 14 and well 16 allows accumulation of mobile charge carriers (holes and electrons) generated when pixel 10 is exposed to light radiation. The holes and electrons so generated do not automatically recombine with other charge carriers (of the opposite charge) because they are formed in the depletion region that resides at the junction of photodiode diffusion 14 and well 16. This depletion region and the adjacent p and n regions may be schematically represented as a capacitor 28 ($C_{pw}$). The capacitance of $C_{pw}$ is sometimes referred to as the photodiode's "intrinsic capacitance"

After pixel 10 has been exposed to light radiation for a defined period of time, the charge accumulated on photodiode-well capacitor 28 may be discharged over a line 18 connected to diffusion 14. The amount of charge read-out over line 18 corresponds to the integrated illumination (the radiation's intensity integrated over the time of exposure to the pixel 10). Thus, by reading the charge on a plurality of pixels, a differential intensity pattern or image may be generated.

A transistor 20 on line 18 controls access to the photodiode. While pixel 10 is exposed to radiation, transistor 20 is off, thereby allowing charge to accumulate within the photodiode. However, after the exposure is complete, transistor 20 may be switched on to allow the charge accumulated in the photodiode to be drawn out over line 18 and quantified by a charge integrator or other detection mechanism.

Before pixel 10 is exposed to radiation, it must be "reset" to ensure that it begins the exposure process with a known reset voltage (and associated charge). After reset, it is presumed that all pixels in the MOS array have nearly the same voltage. Any variation in voltage from pixel to pixel constitutes noise which degrades the image's quality. One source of such noise is the above mentioned thermal or kTC noise introduced when transistor, 20 switches off at the conclusion of the reset process. This noise originates with thermal variations effecting the resistance and capacitance of the channel in transistor 20. Some of these variations may be manifest as temporal changes in the threshold voltage of transistor 20.

To ensure a valid reference voltage for measuring the voltage/charge of the photodiode, well 16 is held at $V_{dd}$. This is accomplished by connecting a power source ($V_{dd}$) through line 22 to well 16 at a tap 24. If well 16 is an n-type region, then tap 24 will be a heavily doped n-type region. It should be understood that the invention also applies to photodiodes of the opposite conductivity type as described in the figures. Specifically, the photodiode pixels could be formed on an n-type substrate. In this case, the well would be p-type and the photodiode diffusion would be n-type. The well is then connected to $V_{ss}$ rather than $V_{dd}$ and the photodiode diffusion is reset to a "high" voltage.

Pixel 10 is represented schematically in FIG. 2A. As shown there, transistor 20 may be represented as a switch on line 18. When transistor 20 is turned off (the switch opens), an error charge (Q∈) is introduced into the photodiode as noise. This error charge is manifest as a voltage error (ΔV∈) on a capacitor 28. As noted, capacitor 28 is defined by the junction capacitance at the interface of photodiode diffusion 14 and well 16 (i.e., $C_{pw}$). Without the error generated by Q∈, the voltage difference across junction capacitor 28 should be the difference of $V_{dd}$ and the reset or referencor reference voltage, $V_r$. As shown, $V_{dd}$ is provided over line 22 through node 24 to well 16. With the addition of the thermal noise error, Q∈, the voltage difference across capacitor 28 is the difference of $V_{dd}$ and ($V_r$+ΔV∈).

While not particularly important during normal operation, it should be noted that a second junction capacitor 32 resides at the interface of well 16 and substrate 12. Note also that substrate 12 is grounded. The voltage drop across junction capacitor 32 ($C_{ws}$) is given by the difference between $V_{dd}$ and the substrate potential (typically $V_{ss}$).

Figure 1B:
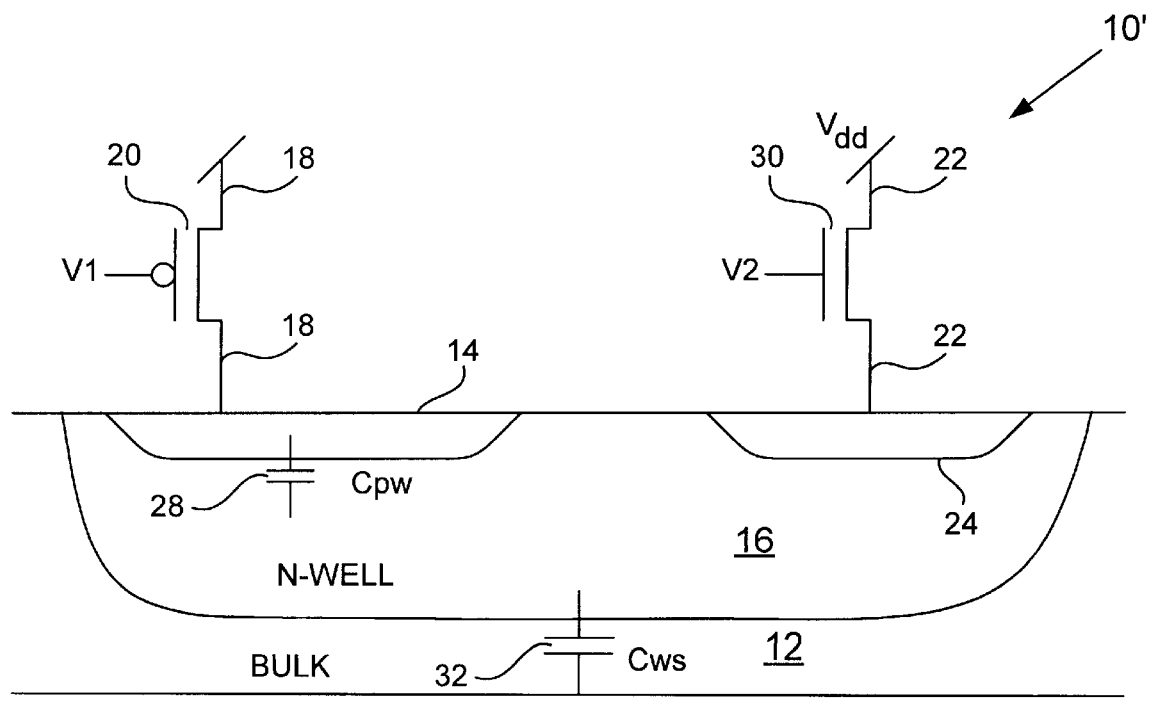
FIG. 1B is a side-sectional illustration of a modified version of the pixel element of the type shown in FIG. 1A. but including a switch allowing controlled application of $V_{dd}$ to a well in the pixel element.

One relatively easy modification to the photodiode pixel described with reference to FIGS. 1A and 2A is presented in FIGS. 1B and 2B. The pixel represented by FIGS. 1B and 2B depict a preferred embodiment of the present invention. This modification allows much of the thermal noise introduced into the photodiode during reset to be canceled. It should be understood that the pixel circuit depicted in FIGS. 1B and 2B is not the only way to implement the methods of this invention. One such method can be most directly understood with reference to the flow chart shown in FIG. 3 which is described below.

As shown in FIGS. 1B and 2B, a pixel 10' representative of pixels of this invention includes the same elements as presented in the pixels of FIGS. 1A and 2A. In addition, pixel element 10' depicted in FIGS. 1B and 2B includes a transistor 30 which allows well 16 to be disconnected form the $V_{dd}$ supply on line 22. Thus, it now becomes possible to allow well 16 to float with respect to power and ground (by disconnecting it from $V_{dd}$). As will be explained shortly, this step is central to allowing thermal noise to be canceled from the photodiode pixel. Thus, any structure or circuit allowing the well of any given pixel to be independently connected to and disconnected from a $V_{dd}$ supply when necessary can implement the present invention. However, the well potential of each photodiode in an array should be separately controllable. Therefore, each pixel may require its own well as depicted in FIG. 1B. This, of course, increases the size of the array with respect to an array of standard pixels. However, when high quality images are required, this increase in area will be acceptable.

While a passive pixel design is illustrated in FIGS. 1B and 2B, the present invention may be practiced with many different pixel designs. For example, an active pixel design—in which the pixel is provided its own amplifier for driving its output on a row line—may also be employed.

Various optical layers/elements may be provided on pixel 10'—at least on diffusion 14. To simplify the diagrams these additional elements are not shown in FIGS. 1B and 2B. These optical elements may include, for example, a lens for optical collection of photons and filters for wavelength discrimination of photons.

As noted, well 16 could be a p-type region and diffusion 14 could be an n-type region. Regardless of conductivity type, the concentration of dopant atoms in regions 14 and 16 should be chosen to create a depletion mode photodiode. In such photodiodes, as mentioned, radiation impinging on photodiode diffusion 14 causes generation of holes and electrons in the depletion region. Because the depletion region does not contain free charge carriers, these newly created holes and electrons are not immediately annihilated by combination with charge carriers of the opposite charge. Thus, they reside as free charge on a capacitor $C_{pw}$ 28.

In one specific embodiment, a plurality of pixels, each having a structure similar to pixel 10', define an array of 1024 (vertical direction) by 1024 (horizontal direction) pixels. Of course the actual array dimensions will depend upon the application and the scale of the IC fabrication technology. In operation, an optical image may be directed onto an array of pixels such that spatial and/or temporal variations in light intensity (or some other radiation feature such as wavelength) may be temporarily recorded by the individual pixels making up the sensor array.

A preferred method of the present invention will now be described with reference to the flow chart of FIG. 3. As shown there, a noise cancellation process 300 begins at 302 and then in a step 304 the system resets the bias at a photodiode to a reference voltage $V_r$. In the circuit shown in FIGS. 1B and 2B, this may be accomplished by simply turning on transistor 20 to establish a conductive path between a source of $V_r$ and photodiode diffusion 14. One source of $V_r$ is a charge integrator connected to line 18. Generally, the process will begin with the well biased to $V_{dd}$ by connection to a $V_{dd}$ source. In the embodiment depicted in FIGS. 1B and 2B, this may have been accomplished by turning on transistor 30 to establish a conductive pathway between a $V_{dd}$ supply and substrate tap 24.

To this point, process 300 resembles a rather conventional process for resetting and preparing a passive photodiode pixel for exposure to an image. Unfortunately, in the prior art, when a pixel that has been reset as described is read after exposure, an error voltage, ΔV∈, forms part of the output. This noise cannot be compensated for and thereby degrades the quality of the output image.

To address this problem, the present invention allows the well to float free of $V_{dd}$ before the photodiode diffusion is disconnected from the reset voltage. Thus, after both the photodiode and the well have been reset as described (step 304), the system disconnects the well from $V_{dd}$, thereby allowing the well to float as indicated at a step 308. This could be accomplished by, for example, simply turning off transistor 30 to allow well 16 to float with respect to $V_{dd}$ and $V_{ss}$.

Next, the system disconnects the photodiode from the $V_r$ source at a step 310. This allows the photodiode to float with respect to $V_r$, $V_{dd}$ and $V_{ss}$. This step may be performed by simply turning off transistor 20. As mentioned, the step of disconnecting from $V_r$ will inject a certain amount of charge which represents noise in the pixel. As a result, a ΔV∈ will be introduced into the photodiode. Normally, ΔV∈ contributes to the potential drop across the well-photodiode diffusion junction capacitor (i.e., capacitor 28) only.

Because the well has been allowed to float (step 308), error voltage (ΔV∈) will distribute over both the well-substrate junction capacitor 32 and the photodiode diffusion-well junction capacitor 28. Because the dopant concentration in diffusion 14 is much greater than dopant concentration in substrate 12, the capacitance of junction capacitor 28 will be much greater than the capacitance junction capacitor 32. Therefore, most of ΔV∈ will be distributed on junction capacitor 32.

Figure 3:
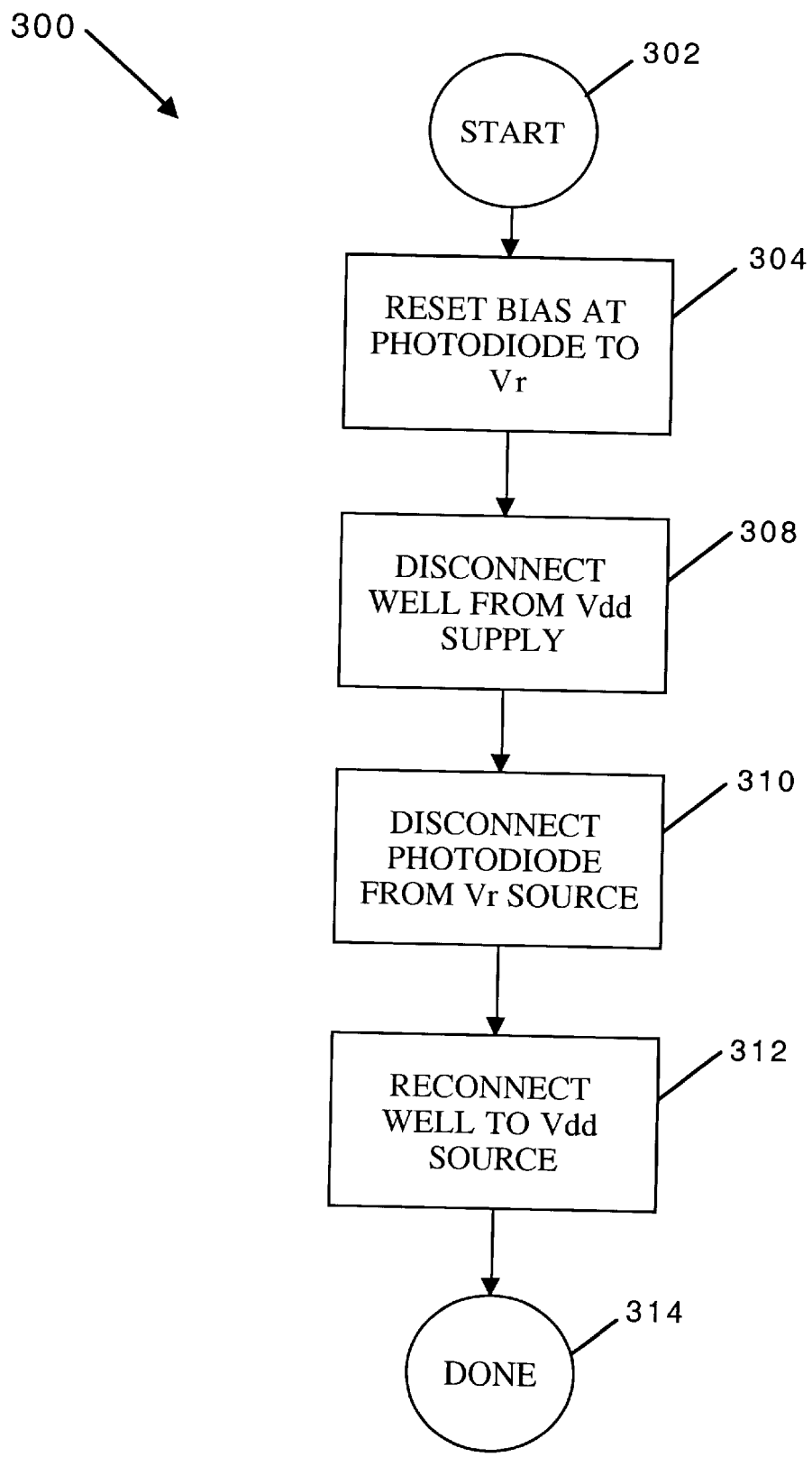
FIG. 3 is a process flow diagram depicting the steps employed to cancel thermal noise in accordance with one embodiment of the present invention.

The portion of ΔV∈ now residing on junction capacitor 32 can be canceled by simply clamping well 16 back to $V_{dd}$ as indicated at a step 312 in FIG. 3. The charge on $C_{ws}$ associated with the kTC noise then goes to $V_{dd}$. Thereafter the process is completed at 314.

In a typical CMOS photodiode array, the ratio of $C_{pw}$ to $C_{ws}$ may be about 2:1. In this case, only a relatively small percentage of $\Delta V_\epsilon$ will be distributed on the $C_{pw}$.

When well 16 is reconnected to the $V_{dd}$ source, the portion of the noise ($\Delta V_\epsilon$) stored on the well-substrate junction capacitor 32 is canceled as the well is reset to $V_{dd}$. There will be some residual noise (a fraction of $\Delta V_\epsilon$ dependent upon the relative sizes of capacitors 28 and 32) still on the photodiode diffusion-well junction capacitor 28. However, this residual noise will typically be significantly below 50% of the total $\Delta V_\epsilon$ which originally distributes over capacitors 28 and 32 when well region 16 is disconnected from the source of $V_{dd}$.

The MOS imagers of this invention may be deployed in various high sensitivity systems for military, scientific, business, and home applications. For example, they will be particularly useful in high sensitivity applications such as night time driving displays for automobiles, high quality digital still cameras, scientific devices such as those provided for astronomy, etc.

Generally, the systems of this invention will include, in addition to the MOS imager chip, optics to capture an image and direct it onto the MOS array. This may include one or more lenses, filters, etc. of the types conventionally employed in image capture systems. The optics and MOS imager will be mounted in a casing such as a camera case. Further, the system may include a memory for temporarily storing captured images for later downloading to a display system. In some instances, the display system itself will form part of the overall imager system.

Although the foregoing invention has been described in some detail for purposes of clarity of understanding, it will be apparent that certain changes and modifications may be practiced within the scope of the appended claims. For example, while the specification has described certain pixel designs which accomplish the objectives of the present invention, many others which will be understood by those of skill in the art from the present disclosure to be within the spirit of the present invention may equally be used. For example, while the specification has exemplified a passive pixel, other pixel types such as active pixels (of photodiode or photogate type) containing on-pixel amplifiers also could benefit from use with the invention. Therefore, the present embodiments are to be considered as illustrative and not restrictive, and the invention is not to be limited to the details given herein, but may be modified within the scope of the appended claims.

What is claimed is:

1. In an image sensor having an array of pixels, each comprising a photodiode diffusion in a well, with the well formed in a semiconductor substrate, a method of compensating for noise, for a given pixel the method comprising:

(a) resetting the bias of the photodiode diffusion by exposing the photodiode diffusion to a reset voltage;

(b) allowing the voltage within the well to float with respect to power and ground;

(c) disconnecting the photodiode diffusion from the reset voltage thereby introducing noise into the photodiode, which noise comprises (i) a first voltage drop across an interface between the photodiode diffusion and the well, and (ii) a second voltage drop, which is greater than the first voltage drop, across an interface between the well and the semiconductor substrate; and (d) reconnecting the well to power or ground, thereby canceling the noise of the second voltage drop.

2. The method of claim 1, further comprising a step of resetting the well to power or ground prior to disconnecting the well.

3. The method of claim 1, wherein (b) and (d) require disconnecting and reconnecting, respectively, said well to power.

4. The method of claim 3, wherein the photodiode diffusion is n-type and the well is p-type.

5. The method of claim 1, further comprising:

(e) exposing the image sensor to a radiation pattern to thereby charge the pixel to a voltage representing a quantity of radiation to which it was exposed.

6. The method of claim 1, wherein the reset voltage is provided by a charge integrator.

7. The method of claim 1, wherein the wells of the pixels are separated from one another.

8. The method of claim 1, wherein (b) requires disconnecting the well from power or ground.

9. An image sensor comprising an array of pixels, at least some pixels in said array comprising:

a semiconductor substrate;

a well of a first conductivity type formed in said semiconductor substrate and separated from wells of adjacent pixels;

a photodiode diffusion of a second conductivity type, opposite that of the first conductivity type, and formed in the well;

a source of power or ground;

a tap to power or ground also formed in the well; and a switch disposed between said source of power and ground and said tap, whereby when said switch is opened, the pixel potential in the well floats.

10. The image sensor of claim 9, wherein said first conductivity type is n-type and said second conductivity type is p-type.

11. The image sensor of claim 10, further comprising circuitry for resetting the pixels.

12. The image sensor of claim 11, wherein the circuitry comprises one or more charge integrators capable of providing a reset voltage to said photodiode diffusion.

13. The image sensor of claim 11, wherein the circuitry for resetting the pixels is coupled to the photodiode diffusion through a switch, whereby when said switch is closed, the photodiode diffusion is held at a reset voltage and when the switch is opened, the photodiode diffusion is unclamped from the reset voltage.

14. The image sensor of claim 13, wherein the reset voltage corresponds to the photodiode diffusion associated with a dark state.

15. The image sensor of claim 9, wherein the pixels are separately addressable.

16. The image sensor of claim 9, wherein the one or more pixels are passive pixels.

17. The MOS image sensor of claim 9, wherein the one or more pixels are active pixels.

18. A system for producing an image of an object, the system comprising:

(a) an imager comprising, (i) a semiconductor substrate, (ii) a well of a first conductivity type formed in said semiconductor substrate and separated from wells of adjacent pixels, (iii) a photodiode diffusion of a second conductivity type, opposite that of the first conductivity type, and formed in the well, (iv) a source of power or ground, (v) a tap to power or ground also formed in the well, and (vi) a switch disposed between said source of power and ground and said tap, whereby when said switch is opened, the pixel potential in the well floats; and (b) means for outputting an image resulting from the outputs of the one or more pixels.

19. The system of claim 18, wherein the image output by the means for outputting is a photograph.

20. The system of claim 18, wherein the means for outputting is a display.

21. The system of claim 18, wherein a plurality of the one or more pixels is arranged in an array such that each of the pixels in said plurality of pixels is separately addressable.

22. The system of claim 18, wherein the one or more pixels are active pixels or passive pixels.

* * * * *